United States Patent
Fournel et al.

(10) Patent No.: US 10,957,539 B2
(45) Date of Patent: Mar. 23, 2021

(54) METHOD FOR BONDING BY DIRECT ADHESION

(71) Applicant: Commissariat a l'energie atomique et aux energies alternatives, Paris (FR)

(72) Inventors: Frank Fournel, Villard-Bonnot (FR); Vincent Larrey, La Murette (FR); Christophe Morales, Saint Pierre de Mesage (FR); Marwan Tedjini, Fontaine (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 83 days.

(21) Appl. No.: 16/207,855

(22) Filed: Dec. 3, 2018

(65) Prior Publication Data

US 2019/0214259 A1 Jul. 11, 2019

(30) Foreign Application Priority Data

Dec. 8, 2017 (FR) ..................... 17 61828

(51) Int. Cl.
*H01L 21/18* (2006.01)
*H01L 21/20* (2006.01)
*H01L 21/67* (2006.01)

(52) U.S. Cl.
CPC ........ *H01L 21/187* (2013.01); *H01L 21/2007* (2013.01); *H01L 21/67092* (2013.01)

(58) Field of Classification Search
CPC ..................................................... H01L 21/18
See application file for complete search history.

(56) References Cited

U.S. PATENT DOCUMENTS

| 2008/0014712 A1* | 1/2008 | Bourdelle ............. H01L 21/187 438/455 |
| 2008/0196747 A1* | 8/2008 | Fournel ............. H01L 21/02049 134/26 |
| 2011/0129986 A1 | 6/2011 | Libralesso et al. |

OTHER PUBLICATIONS

French Preliminary Search Report dated Aug. 17, 2018 in French Application 17 61828, filed on Dec. 8, 2017 (with English Translation of Categories of Cited Documents & Written Opinion).

* cited by examiner

*Primary Examiner* — Marvin Payen
(74) *Attorney, Agent, or Firm* — Oblon, McClelland, Maier & Neustadt, L.L.P.

(57) ABSTRACT

A process includes the successive steps of: a) providing first and second substrates, each including a first surface and an opposite, second surface, lateral edges connecting the first and second surfaces, b) bonding the first substrate to the second substrate by direct bonding with the first surfaces of the first and second substrates so as to form a bonding interface (IC), and making the lateral edges of the first and second substrates hydrophobic on either side of the bonding interface (IC).

15 Claims, 2 Drawing Sheets

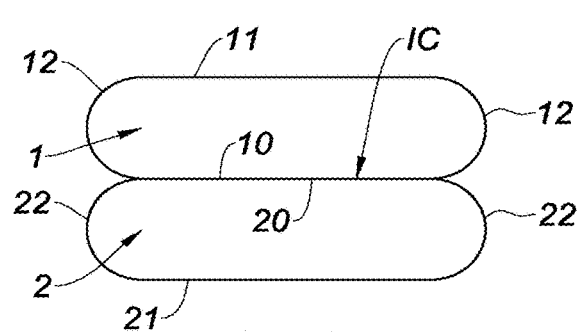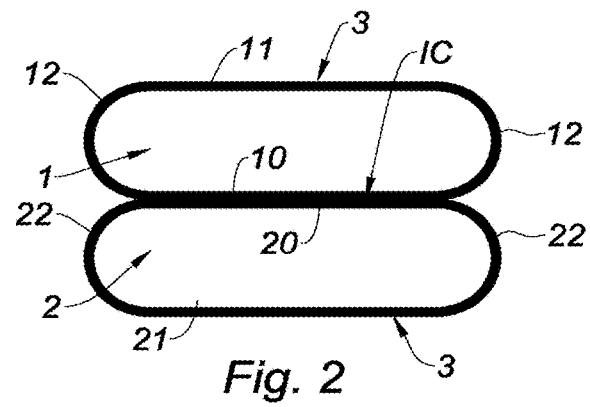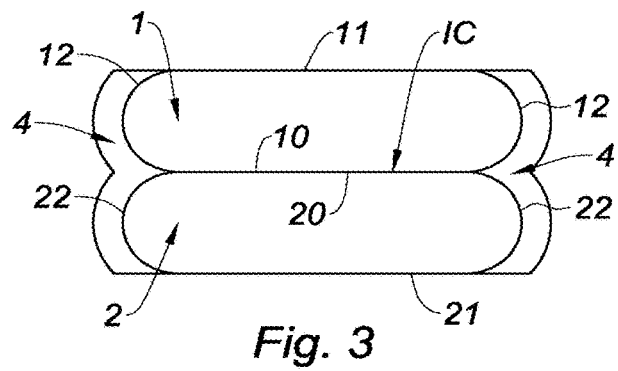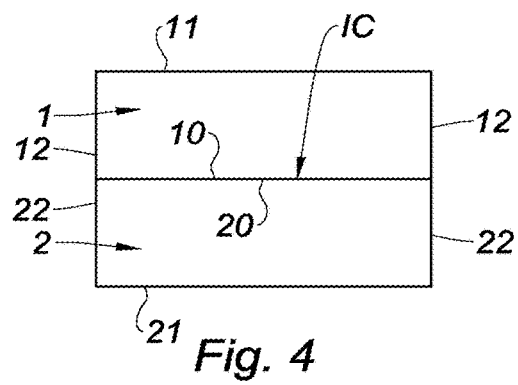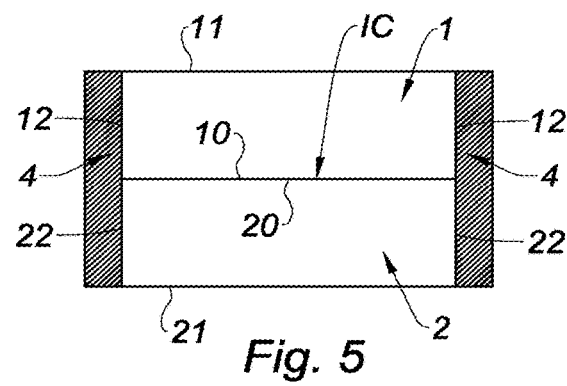

METHOD FOR BONDING BY DIRECT ADHESION

TECHNICAL FIELD

The invention relates to the technical field of attaching two substrates to one another by direct bonding.

A particular application of the invention is in the transfer of thin layers for fabricating electronic devices.

STATE OF THE PRIOR ART

A direct bonding process known from the prior art, in particular from the document by M. Tedjini et al., "*Interface water diffusion in silicon direct bonding*", Appl. Phys. Lett., 109, 111603, 2016 (D1 hereinafter), includes the steps of:
- $a_0$) providing first and second substrates, each comprising a first surface and an opposite, second surface;
- $b_0$) bonding the first substrate to the second substrate by direct bonding with the first surfaces of the first and second substrates so as to form a bonding interface.

D1 teaches that the bonding interface is not isolated from the atmosphere under which step $b_0$) is carried out. In particular, water molecules are able to enter the bonding interface, following certain kinetics, and may do so before a thermal annealing step $c_0$) at high temperature (at a temperature of more than 1000° C.) is carried out. This ingress of water molecules into the bonding interface leads to the formation of defects and to the adhesion of the bonding interface changing.

Such a prior art process is therefore not completely satisfactory inasmuch as it appears to be necessary:
- (i) either to control the atmosphere (in particular the humidity level) under which step $b_0$) is carried out until step $c_0$) is to be carried out;
- (ii) or to carry out step $c_0$) soon after step $b_0$), i.e. faster than the kinetics of the ingress of water into the bonding interface, which means stringent management of the waiting time for the bonded substrates.

Furthermore, according to the envisaged application, steps that come between steps $b_0$) and $c_0$) are likely to have to be carried out in an environment that is very wet, and hence potentially damaging for the bonding interface. For example, the following may be cited:
- an acoustic characterization step before step $c_0$); or
- a grinding step before step $c_0$), allowing heterostructures to be thinned so as to withstand thermal annealing despite different thermal expansion coefficients.

DISCLOSURE OF THE INVENTION

The invention aims to completely or partly overcome the aforementioned drawbacks. To this end, a subject of the invention is a process for attaching a first substrate to a second substrate by direct bonding including the successive steps of:
- a) providing the first and second substrates, each comprising:
  - a first surface and an opposite, second surface;
  - lateral edges connecting the first and second surfaces;
- b) bonding the first substrate to the second substrate by direct bonding with the first surfaces of the first and second substrates so as to form a bonding interface;
- c) making the lateral edges of the first and second substrates hydrophobic on either side of the bonding interface.

Thus, such a process according to the invention makes it possible, by virtue of step c), to isolate the bonding interface from the surrounding atmosphere, in particular from water molecules, which cannot penetrate it. It is therefore not necessary to control the atmosphere, in particular the humidity level thereof. Additionally, a thermal annealing step at high temperature (at a temperature of more than 1000° C.) may then be carried out later without any restriction on the waiting time, and without any concerns regarding the kinetics of the ingress of water into the bonding interface.

This isolation of the bonding interface conferred by step c) is localized to the lateral edges of the first and second substrates, on either side of the bonding interface (hence without penetrating the bonding interface), and it is done in this way in order to avoid damaging the bonding interface when carrying out step c). It should be noted that the isolation of the bonding interface conferred by step c) may extend to the second surfaces of the first and second substrates. In other words, it is possible to make the second surfaces of the first and second substrates hydrophobic as well in step c), for the sake of simplicity of implementation. However, the hydrophobic character of the second surfaces of the first and second substrates has no technical effect on the ingress of water molecules into the bonding interface, unlike the hydrophobic character of the lateral edges of the first and second substrates.

Definitions

The term "substrate" is understood to mean a self-supporting physical carrier, produced in a base material allowing an electronic device or an electronic component to be fabricated. A substrate is conventionally a wafer cut from a monocrystalline ingot of semiconductor material.

The term "direct bonding" is understood to mean spontaneous bonding resulting from two surfaces being brought into direct contact, i.e. bonding in the absence of an additional element such as an adhesive, a wax or a solder. The bonding is mainly the result of van der Waals forces from the electronic interaction between the atoms or molecules of two surfaces, hydrogen bonds due to surface preparations or covalent bonds formed between the two surfaces. The terms "molecular bonding" and "direct bonding" are also used. Direct bonding is advantageously carried out at ambient temperature and pressure, and should not be conflated with thermocompression bonding, eutectic bonding or anodic bonding. Direct bonding may be followed by thermal annealing for strengthening.

The term "hydrophobic" is understood to mean a surface that is characterized by a contact angle with a drop of water of between 50° and 180°, preferably between 70° and 180°, more preferably between 90° and 180°, and even more preferably between 90° and 150°.

The process according to the invention may include one or more of the following features.

According to one feature of the invention, step c) is carried out by forming a layer on the lateral edges of the first and second substrates on either side of the bonding interface, said layer being produced in a hydrophobic material.

Thus, one advantage afforded by a dedicated layer is that it makes it possible to provide the hydrophobic character regardless of the material of the first and second substrates.

According to one feature of the invention, the hydrophobic material is selected from paraffin wax or a fluorinated coating.

According to one feature of the invention, step c) is carried out by applying a hydrophobic treatment to the lateral edges of the first and second substrates on either side of the bonding interface.

Thus, one advantage afforded by a hydrophobic treatment to the lateral edges is simplicity of implementation. It is not necessary to form, and then remove, a dedicated layer.

According to one feature of the invention, the hydrophobic treatment is a chemical treatment, preferably applied by means of an acid solution or by means of acid vapour.

According to one feature of the invention, the hydrophobic treatment is a surface treatment, preferably applied by means of a plasma, more preferably a fluorine-based plasma.

According to one feature of the invention, step b) is followed by a step consisting in applying a heat treatment to the bonded first and second substrates, the heat treatment being carried out at a temperature of between 100° C. and 300° C.

Thus, one advantage afforded by such a heat treatment is that it slows the kinetics of the ingress of water into the bonding interface, and does so without closing off the bonding interface, i.e. water molecules are still able to enter the bonding interface where empty spaces remain. Such a heat treatment allows the waiting time before carrying out step c) to be longer without risking damage to the bonding interface.

According to one feature of the invention, step b) is carried out at a temperature of between 20° C. and 30° C.

Thus, bonding step b) is carried out at ambient temperature.

According to one feature of the invention, step c) is carried out subsequent to step b), after a waiting time of less than six hours, preferably less than one hour, more preferably less than 15 minutes.

Thus, one advantage afforded by such waiting times is that step c) is carried out early enough, i.e. before the kinetics of the ingress of water into the bonding interface take effect.

According to one feature of the invention, the lateral edges of the first and second substrates provided in step a) are produced in a material selected from Si, Ge, a silicon oxide, SiC, a III-V material, a II-VI material.

The term "A-B material" is understood to mean a binary alloy between elements that are located in group A and in group B, respectively, of the periodic table of elements.

BRIEF DESCRIPTION OF THE DRAWINGS

Other features and advantages will become apparent in the detailed description of various embodiments of the invention, the description being accompanied by examples and references to the appended drawings.

FIG. 1 is a sectional schematic view along the normal to the first and second surfaces of the first and second substrates, illustrating direct bonding of two substrates with rounded edges.

FIG. 2 is a sectional schematic view along the normal to the first and second surfaces of the first and second substrates, illustrating direct bonding of two substrates with rounded edges, and each covered with an oxide.

FIG. 3 is a sectional schematic view along the normal to the first and second surfaces of the first and second substrates, illustrating the formation of a hydrophobic layer on the rounded lateral edges of the substrates.

FIG. 4 is a sectional schematic view along the normal to the first and second surfaces of the first and second substrates, illustrating direct bonding of two substrates with sheer edges.

FIG. 5 is a sectional schematic view along the normal to the first and second surfaces of the first and second substrates, illustrating the formation of a hydrophobic layer on the sheer lateral edges of the two substrates.

FIGS. 1 to 5 are not shown to scale in order to facilitate the understanding thereof.

DETAILED DESCRIPTION OF EMBODIMENTS

Figure 6A:
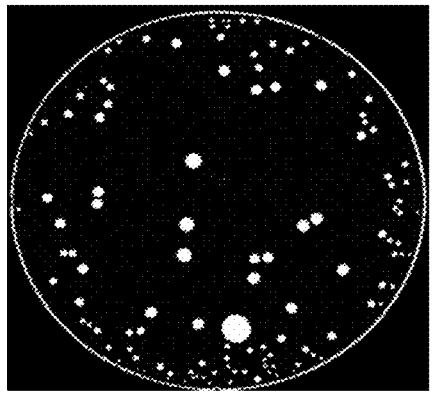
FIGS. 6*a* and 6*b* are images obtained by acoustic microscopy, illustrating the effects of the presence and of the absence, respectively, of a hydrophobic layer on the quality of the bonding interface, the bonding interface being immersed for one week in liquid water after the formation of the hydrophobic layer.

Those elements that are identical or perform the same function will bear the same references for the various embodiments, for the sake of simplicity.

A subject of the invention is a process for attaching a first substrate 1 to a second substrate 2 by direct bonding including the successive steps of:
  a) providing the first and second substrates 1, 2, each comprising:
    a first surface 10, 20 and an opposite, second surface 11, 21;
    lateral edges 12, 22 connecting the first and second surfaces 10, 20, 11, 21;
  b) bonding the first substrate 1 to the second substrate 2 by direct bonding with the first surfaces 10, 20 of the first and second substrates 1, 2 so as to form a bonding interface IC;
  c) making the lateral edges 12, 22 of the first and second substrates 1, 2 hydrophobic on either side of the bonding interface IC.

First and Second Substrates

The first and/or second substrates 1, 2 may be produced in a semiconductor material. The first and/or second substrates 1, 2 may be covered with an oxide 3.

The lateral edges 12, 22 of the first and second substrates 1, 2 provided in step a) may be produced in a material selected from Si, Ge, a silicon oxide, SiC, a III-V material, a II-VI material.

As illustrated in FIGS. 1 to 3, the lateral edges 12, 22 of the first and second substrates 1, 2 may have rounded edges due to the presence of chamfers. As illustrated in FIGS. 4 and 5, the lateral edges 12, 22 of the first and second substrates 1, 2 may have sheer edges.

Bonding Step b)

Step b) is preferably carried out at ambient temperature, i.e. at a temperature of between 20° C. and 30° C. However, step b) may be carried out at a higher temperature, for example between 200° C. and 400° C.

Step b) may be carried out at ambient pressure.

Step b) is a step of hydrophilic bonding between the first and second substrates 1, 2. The term "hydrophilic" is understood to mean a surface that is characterized by a contact angle with a drop of water that is smaller than or equal to 40°, preferably smaller than or equal to 10°.

Step c): Making the Lateral Edges Hydrophobic

According to a first implementation, step c) is carried out by forming a layer 4 on the lateral edges 12, 22 of the first and second substrates 1, 2 on either side of the bonding interface IC, said layer 4 being produced in a hydrophobic material. The hydrophobic material is advantageously selected from paraffin wax or a fluorinated coating. By way of nonlimiting examples, when the first and second substrates 1, 2 are produced in silicon or covered with a silicon oxide the fluorinated coating may be:

a Novec™ 2702 coating, sold by 3M™;

a Novec™ 1700 coating, sold by 3M™.

According to a second implementation, step c) is carried out by applying a hydrophobic treatment to the lateral edges 12, 22 of the first and second substrates 1, 2 on either side of the bonding interface IC.

According to a first variant, the hydrophobic treatment is a chemical treatment, preferably applied by means of an acid solution or by means of acid vapour. When the first and second substrates 1, 2 are produced in silicon, the chemical treatment may be applied by means of an HF solution or by means of HF vapour. When the first and second substrates 1, 2 are produced in InP, the chemical treatment may be applied by means of an HCl solution or by means of HCl vapour. Such a chemical treatment may also make the second surfaces 11, 21 of the first and second substrates 1, 2 hydrophobic without, however, having any technical effect on the ingress of water molecules into the bonding interface IC.

According to a second variant, the hydrophobic treatment is a surface treatment, preferably applied by means of a plasma, more preferably a fluorine-based plasma. The fluorine-based plasma may be a $CF_4$ or a $CHF_3$ plasma. When the first and second substrates 1, 2 are produced in silicon or covered with silicon dioxide, the surface treatment may be applied by means of a $CF_4$ plasma. Such a surface treatment may also make the second surfaces 11, 21 of the first and second substrates 1, 2 hydrophobic without, however, having any technical effect on the ingress of water molecules into the bonding interface IC.

Step c) is carried out subsequent to step b), advantageously after a wait of less than six hours, preferably less than one hour, more preferably less than 15 minutes. The wait between steps b) and c) advantageously takes place in a dry atmosphere, i.e. an atmosphere holding less than 1 ppm of water.

Heat Treatment: Slowing the Kinetics of the Ingress of Water

Step b) is advantageously followed by a step $b_1$) consisting in applying a heat treatment to the bonded first and second substrates 1, 2, the heat treatment being carried out at a temperature of between 100° C. and 300° C. Step $b_1$) is carried out before step c).

Thermal Annealing: Strengthening the Bonding Interface

The process advantageously includes a step d) consisting in applying a thermal annealing treatment to the bonded first and second substrates 1, 2, step d) being carried out after step c). The thermal annealing treatment applied in step d) is advantageously carried out at a temperature of more than or equal to 1000° C.

The process advantageously includes a step, carried out immediately before step d), consisting in:

removing the layer 4 formed in step c);

or annihilating the hydrophobic treatment applied in step c).

Implementation Example No. 1

The first and second substrates 1, 2 are two (001) silicon wafers of 200 mm in diameter and 725 µm in thickness. The first and second substrates 1, 2 are cleaned and hydrolysed in baths of ozonated deionized water and in an APM (ammonia-peroxide mixture) solution at 70° C. so that the bonding surfaces are hydrophilic. The first and second substrates 1, 2 are direct-bonded at ambient temperature and at ambient pressure.

Step c) is carried out by forming a fluorinated coating on the lateral edges 12, 22 of the first and second substrates 1, 2 on either side of the bonding interface IC, as well as on the second surfaces 11, 21 of the first and second substrates 1, 2. In order to achieve this, step c) is carried out by turning the bonded first and second substrates 1, 2 in a bath of Novec™ 2702. Excess fluorinated coating may be removed using a solvent (e.g. Novec™ 7200) and by rinsing with isopropyl alcohol (IPA). This fluorinated coating may be removed later by means of an $O_2$ plasma.

In order to obtain a comparative study, implementation example No. 1 was repeated without step c).

Figure 6B:
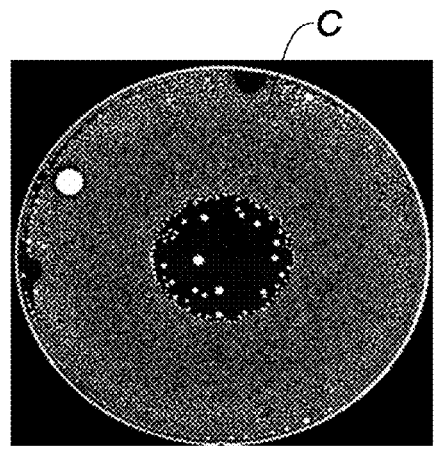

Results are illustrated in FIGS. 6*a*, 6*b*, after the following steps:

the substrates 1, 2 are thermally annealed at 150° C. for 30 minutes;

the substrates 1, 2 are immersed in liquid water for one week;

the substrates 1, 2 are dried and thermally annealed at 300° C. for two hours.

The absence of a ring C of defects once step c) has been carried out is observed.

Figure 7A:
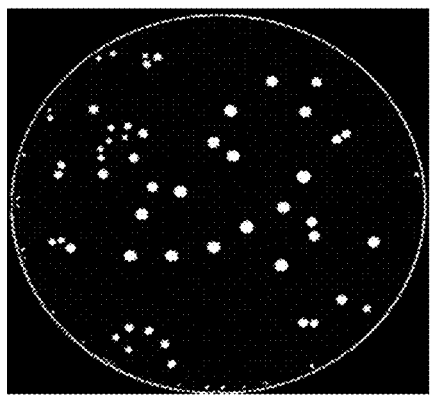
FIGS. 7*a* and 7*b* are images obtained by acoustic microscopy, illustrating the effects of the presence and of the absence, respectively, of a hydrophobic layer on the quality of the bonding interface, the bonding interface being subjected to storage for one week in humid air (45% relative humidity) after the formation of the hydrophobic layer.
Figure 7B:
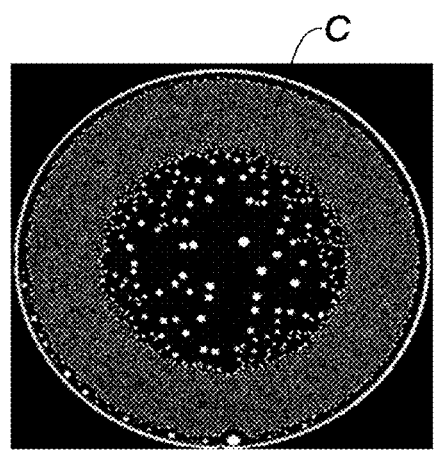

Similarly, results are illustrated in FIGS. 7*a*, 7*b*, after the following steps:

the substrates 1, 2 are thermally annealed at 150° C. for 30 minutes;

the substrates 1, 2 are stored in humid air (45% relative humidity) for one week;

the substrates 1, 2 are dried and thermally annealed at 300° C. for two hours.

The absence of a ring C of defects once step c) has been carried out is again observed.

Furthermore, it was observed that carrying out step c) also prevents water from escaping from the bonding interface IC. In order to achieve this, implementation example No. 1 was modified by introducing a step consisting in immersing the substrates 1, 2 in liquid water for two weeks before carrying out step c). Additionally, as above, modified implementation example No. 1 was repeated without step c) in order to obtain a comparative study.

Figure 8A:
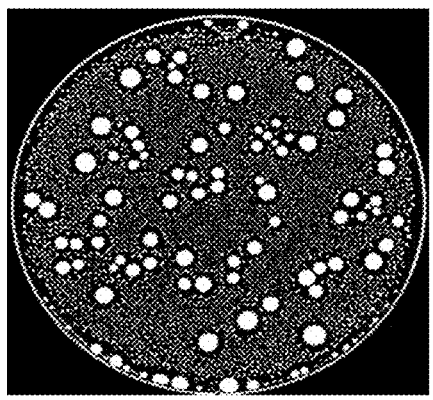
FIGS. 8*a* and 8*b* are images obtained by acoustic microscopy, illustrating the effects of the presence and of the absence, respectively, of a hydrophobic layer on the quality of the bonding interface, the bonding interface being immersed for two weeks in liquid water before the formation of the hydrophobic layer. After the formation of the hydrophobic layer, the bonded substrates are stored for two days.
Figure 8B:
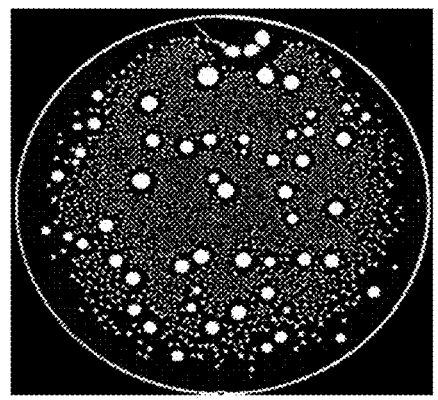

Results are illustrated in FIGS. 8*a*, 8*b*, after the following steps:

the substrates 1, 2 are thermally annealed at 150° C. for 30 minutes;

the substrates 1, 2 are stored in a dry nitrogen atmosphere (less than 1 ppm of water) for two days;

the substrates 1, 2 are thermally annealed at 300° C. for two hours.

The presence of a ring C of defects up to the edge once step c) has been carried out is observed, which demonstrates that carrying out step c) prevents water from escaping from the bonding interface IC.

Implementation Example No. 2

The first and second substrates 1, 2 are two (001) silicon wafers of 200 mm in diameter and 725 µm in thickness. The first and second substrates 1, 2 are cleaned and hydrolysed in baths of ozonated deionized water and in an APM (ammonia-peroxide mixture) solution at 70° C. so that the bonding surfaces are hydrophilic. The first and second substrates 1, 2 are direct-bonded at ambient temperature and at ambient pressure.

Step c) is carried out by forming a fluorinated coating on the lateral edges 12, 22 of the first and second substrates 1, 2 on either side of the bonding interface IC, as well as on the second surfaces 11, 21 of the first and second substrates 1, 2. In order to achieve this, step c) is carried out while turning the bonded first and second substrates 1, 2 in a bath of Novec™ 1700. Excess fluorinated coating may be removed using a solvent (e.g. Novec™ 7200 or 7100) and by rinsing with isopropyl alcohol (IPA). This fluorinated coating may be removed later by means of an $O_2$ plasma.

Implementation Example No. 3

The first and second substrates 1, 2 are two (001) silicon wafers of 200 mm in diameter and 725 µm in thickness. The first and second substrates 1, 2 are cleaned and hydrolysed in baths of ozonated deionized water and in an APM (ammonia-peroxide mixture) solution at 70° C. so that the bonding surfaces are hydrophilic. The first and second substrates 1, 2 are direct-bonded at ambient temperature and at ambient pressure.

Step c) is carried out by adding paraffin wax to the lateral edges 12, 22 of the first and second substrates 1, 2 on either side of the bonding interface IC, as well as to the second surfaces 11, 21 of the first and second substrates 1, 2. In order to achieve this, step c) is carried out by turning the bonded first and second substrates 1, 2 in a bath of molten paraffin wax. The paraffin wax may be removed later by means of a solvent such as acetone.

Implementation Example No. 4

The first and second substrates 1, 2 are two (001) silicon wafers of 200 mm in diameter and 725 µm in thickness. The first and second substrates 1, 2 are cleaned and hydrolysed in baths of ozonated deionized water and in an APM (ammonia-peroxide mixture) solution at 70° C. so that the bonding surfaces are hydrophilic. The first and second substrates 1, 2 are direct-bonded at ambient temperature and at ambient pressure.

Step c) is carried out by means of a hydrophobic chemical treatment, applied to the lateral edges 12, 22 of the first and second substrates 1, 2 on either side of the bonding interface IC, as well as to the second surfaces 11, 21 of the first and second substrates 1, 2. In order to achieve this, step c) is carried out by turning the bonded first and second substrates 1, 2 in a 10% HF bath. Such a chemical treatment may be annihilated later using an APM solution at 70° C., or using an $O_2$ plasma.

Implementation Example No. 5

The first and second substrates 1, 2 are two (001) silicon wafers of 200 mm in diameter and 725 µm in thickness. The first and second substrates 1, 2 are cleaned and hydrolysed in baths of ozonated deionized water and in an APM (ammonia-peroxide mixture) solution at 70° C. so that the bonding surfaces are hydrophilic. The first and second substrates 1, 2 are direct-bonded at ambient temperature and at ambient pressure.

Step c) is carried out by means of a hydrophobic surface treatment, applied to the lateral edges 12, 22 of the first and second substrates 1, 2 on either side of the bonding interface IC, as well as to the second surfaces 11, 21 of the first and second substrates 1, 2. In order to achieve this, step c) is carried out by subjecting the bonded first and second substrates 1, 2 to a $CF_4$ plasma. Such a surface treatment may be annihilated later using an APM solution at 70° C., or using an $O_2$ plasma.

The invention is not limited to the described embodiments. A person skilled in the art is capable of considering all technically feasible combinations thereof and of substituting them with equivalents.

The invention claimed is:

1. A process for attaching a first substrate to a second substrate by direct bonding, the process comprising:
    a) providing the first and second substrates, each comprising:
        a first surface and an opposite, second surface, and lateral edges connecting the first and second surfaces;
    b) bonding the first substrate to the second substrate by direct bonding with the first surfaces of the first and second substrates so as to form a bonding interface (IC); and
    c) making, after the bonding, the lateral edges of the first and second substrates hydrophobic on either side of the bonding interface (IC).

2. The process according to claim 1, wherein c) is carried out by forming a layer on the lateral edges of the first and second substrates on either side of the bonding interface (IC), said layer being produced in a hydrophobic material.

3. The process according to claim 2, wherein the hydrophobic material is selected from paraffin wax or a fluorinated coating.

4. The process according to claim 1, wherein c) is carried out by applying a hydrophobic treatment to the lateral edges of the first and second substrates on either side of the bonding interface (IC).

5. The process according to claim 4, wherein the hydrophobic treatment is a chemical treatment applied by an acid solution or acid vapour.

6. The process according to claim 4, wherein the hydrophobic treatment is a surface treatment applied by a plasma.

7. The process according to claim 1, wherein b) is followed by applying a heat treatment to the bonded first and second substrates, the heat treatment being carried out at a temperature of between 100° C. and 300° C.

8. A process for attaching a first substrate to a second substrate by direct bonding, the process comprising:
    a) providing the first and second substrates, each comprising:
        a first surface and an opposite, second surface, and lateral edges connecting the first and second surfaces;
    b) bonding the first substrate to the second substrate by direct bonding with the first surfaces of the first and second substrates so as to form a bonding interface (IC), wherein b) is carried out at a temperature of between 20° C. and 30° C.; and
    c) making the lateral edges of the first and second substrates hydrophobic on either side of the bonding, interface (IC).

9. The process according to claim 1, wherein c) is carried out subsequent to b), after a waiting time of less than six hours.

10. The process according to claim 1, wherein the lateral edges of the first and second substrates provided in a) are produced in a material selected from Si, Ge, a silicon oxide, SiC, a III-V material, a II-VI material.

11. The process according to claim 4, wherein the hydrophobic treatment is a surface treatment applied by a fluorine-based plasma.

12. The process according to claim 1, wherein c) is carried out subsequent to b), after a waiting time of less than one hour.

13. The process according to claim 1, wherein c) is carried out subsequent to b), after a waiting time of less than 15 minutes.

14. The process according to claim 1, wherein the bonding in b) is hydrophilic bonding.

15. A process for attaching a first substrate to a second substrate by direct bonding, the first and second substrates each including a first surface and an opposite, second surface, and lateral edges connecting the first and second surfaces, the process comprising:

bonding the first substrate to the second substrate by direct bonding with the first surfaces of the first and second substrates so as to form a bonding interface (IC); and making, after the bonding, the lateral edges of the first and second substrates hydrophobic on either side of the bonding interface (IC).

* * * * *